(12) United States Patent
Wang et al.

(10) Patent No.: US 12,322,608 B2
(45) Date of Patent: Jun. 3, 2025

(54) APPARATUS AND METHODS FOR CLEANING A PACKAGE

(71) Applicant: Taiwan Semiconductor Manufacturing Co., Ltd., Hsinchu (TW)

(72) Inventors: Ying-Hao Wang, Tainan (TW); Chien-Lung Chen, Zhubei (TW); Chien-Chi Tzeng, Hsinchu (TW); Meng-Fu Shih, Taichung (TW); Hu-Wei Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 274 days.

(21) Appl. No.: 17/751,185

(22) Filed: May 23, 2022

(65) Prior Publication Data

US 2023/0377910 A1    Nov. 23, 2023

(51) Int. Cl.
*H01L 21/67* (2006.01)
*H01L 21/677* (2006.01)

(52) U.S. Cl.
CPC .. *H01L 21/67051* (2013.01); *H01L 21/67121* (2013.01); *H01L 21/67706* (2013.01); *H01L 21/67742* (2013.01)

(58) Field of Classification Search
CPC .................................................. H01L 21/67051
See application file for complete search history.

(56) References Cited

U.S. PATENT DOCUMENTS

2022/0104676 A1*    4/2022   Xie ........................ G05D 1/661

* cited by examiner

*Primary Examiner* — Jason Y Ko
(74) *Attorney, Agent, or Firm* — Slater Matsil, LLP

(57) ABSTRACT

An apparatus for cleaning a package device is provided. The apparatus includes a package device loader; a package device unloader; a first cleaning area disposed between the package device loader and the package device unloader; and a conveyor. The conveyor includes a frame extending from the package device loader to the package device unloader and through the first cleaning area; and a belt wrapping the frame, wherein the belt includes a movable upper surface between the package device loader and the package device unloader, wherein the movable upper surface is configured to move relative to and over the frame, and a first distance between the movable upper surface and the frame in the first cleaning area increases in a direction from the package device loader to the package device unloader.

20 Claims, 10 Drawing Sheets

300

302 — Loading a package device by a package device loader and disposing the package device on a conveyor that extends from the package device loader to a package device unloader

304 — Transferring the package device to pass through a first cleaning area by a first section of the conveyor for performing a chemical cleaning process, wherein the first section of the conveyor includes a first movable upper surface that is more distant away from a ground surface along a direction from the package device loader to the package device unloader

306 — Transferring the package device to pass through a second cleaning area by a second section of the conveyor for performing a dry cleaning process, wherein the second section of the conveyor includes a second movable upper surface that includes at least a portion less distant away from the ground surface along the direction

308 — Transferring the package device to pass through a third cleaning area by a third section of the conveyor for performing a water rinse cleaning process, wherein the third section of the conveyor includes a third movable upper surface that is more distant away from the ground surface along the direction

310 — Transferring the package device to the package device unloader

Figure 4

APPARATUS AND METHODS FOR CLEANING A PACKAGE

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a method of cleaning a package device in accordance with some embodiments.

DETAILED DESCRIPTION

Figure 1:
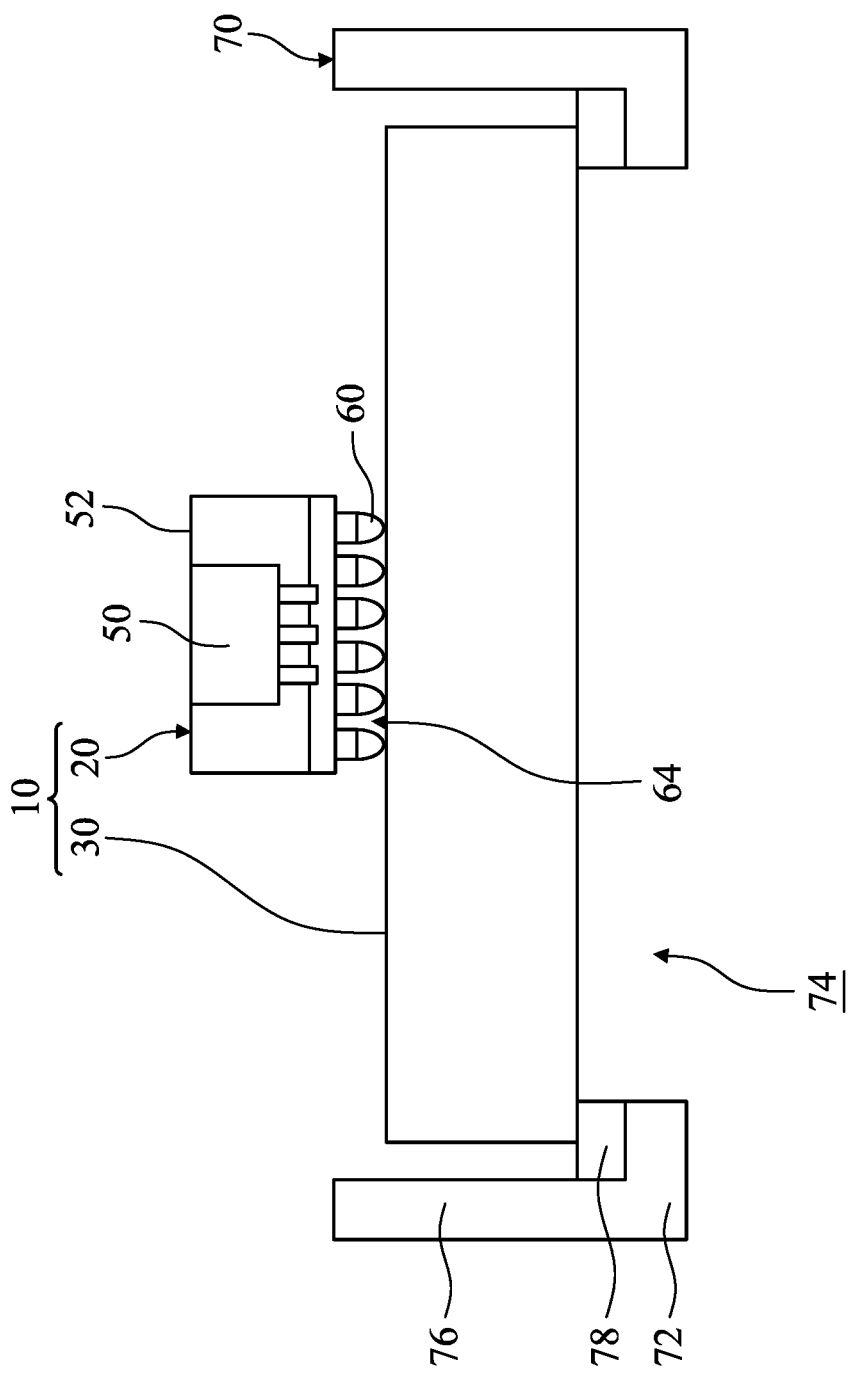
FIG. 1 illustrates a cross-sectional view of a package device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a package device cleaning apparatus and a method of cleaning a package device using the package device cleaning apparatus are provided. The package device cleaning apparatus may include a conveyor configured to transfer the package device to pass through various cleaning areas for performing various cleaning processes. In some embodiments, respective sections of the conveyor in wet cleaning areas are tilted from a base frame or a ground surface, and the package device disposed thereon for being transferred and cleaned by a cleaning solution is also tilted. Accordingly, the cleaning solution flowing through gaps between conductive connectors of the package device may have an increased flow rate accelerated by gravity, thereby improving cleaning performance and efficiency. The variation and the operation are discussed. Throughout the various views and illustrative embodiments, like reference numbers are used to designate similar features.

FIG. 1 illustrates a package device 10 in accordance with some embodiments. The package device 10 may include a plurality of different package components. The package components may include a device die, an interposer, a package substrate, a printed circuit board (PCB), the like, or a combination thereof. For example, FIG. 1 illustrates embodiments of the package device 10 which is a package-on-package device. The package-on-package device includes a package component 20 stacked on a package component 30. In some embodiments, the package component 20 includes an integrated circuit die 50 surrounded by a packaging material 52, such as a molding material. The package component 30 may include other integrated circuit dies or be a package substrate or an interposer not including integrated circuit dies. In some embodiments, the integrated circuit die 50 is a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The package component 20 and the package component 30 may each include bond pads (not shown), and conductive connectors 60 may be bonded to the bond pads of the package components 20 and 30. The conductive connectors 60 may be ball grid array (BGA) connectors, controlled collapse chip connection (C4) bumps, micro bumps, metal pillars, electroless nickel-electroless palladium-immersion gold technique (ENEPIG) formed bumps, a combination thereof, or the like. The conductive connectors 60 may include a conductive material such as solder, copper, aluminum, gold, nickel, silver, palladium, tin, the like, or a combination thereof.

In some embodiments, the conductive connectors 60 are formed by applying a solder flux or a solder paste to the bonding pads of one of the package components 20 and 30 and then placing solder balls onto the bond pads. The solder flux or the solder paste may improve the wetting characteristics of the bonding pads. Once the solder balls have been mounted on the bond pads, a reflow may be performed in order to shape the material of the conductive connectors 60 into the desired bump shapes. After the reflow, the conductive connectors 60 are bonded to the bond pads of the other one of the package components 20 and 30 to form the package device 10. In some embodiments, the conductive connectors 60 comprise metal pillars (such as a copper pillar) formed by sputtering, printing, electro plating, electroless plating, CVD, or the like. The metal pillars may be formed on bond pads of one of the package components 20 and 30, such as the package component 20 illustrated in FIG. 1. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive connectors 60 may also comprise micro solder bumps on the metal pillars for jointing the metal pillars to bond pads of the other one of the package components, such as the package component 30 illustrated in FIG. 1. The solder flux or solder paste may be applied to the metal pillars before the jointing for bond pads.

After the package device 10 is formed, the package device 10 may be mounted onto a tray 70 (or a boat) for being transferred to other apparatuses to perform subsequent processes. In some embodiments, the tray 70 is designed for being transferred by a device transferring tool (not shown), which may transfer the tray 70 between fabrication apparatuses in a factory. In some embodiments, the tray 70 includes a base 72 having a slot 74 and sidewalls 76 surrounding the slot 74. The tray 70 may also include a spacer 78 disposed over the base 72, surrounding the slot 74, and being surrounded by the sidewalls 76. The spacer 78 may have a square ring shape, a rectangular ring shape, a circular ring shape, and the like in a plan view. The spacer 78 may have a horizontal upper surface. The package device 10 may be disposed over the horizontal upper surface of the spacer 78 for being transferred by the device transferring tool.

In some embodiments, the package device 10 may be transferred to a package device cleaning apparatus for performing cleaning processes to remove contaminants or residual solder flux or solder paste (collectively referred to as contaminants) stuck in gaps 64 between the conductive connectors 60 and attached on the package components 20 and 30. In some embodiments, to meet the industry demands of high performance and compact sizes, the package device 10 has an increased number of the conductive connectors 60 with fine pitches, thereby forming numerous gaps 64 between adjacent conductive connectors 60. For example, in some embodiments in which the conductive connectors 60 comprise metal pillars, the gaps 64 between the adjacent conductive connectors 60 are in a range from 5 um to 100 um. In some embodiments, the gaps 64 are narrow and may increase capillary force, which may attract the cleaning solution and reduce the flow rate of the cleaning solution to flow through the gaps 64. The cleaning solution thus may not have sufficient momentum to flow through all of the gaps 64 and carry the contaminants to leave the gaps 64.

Figure 2:
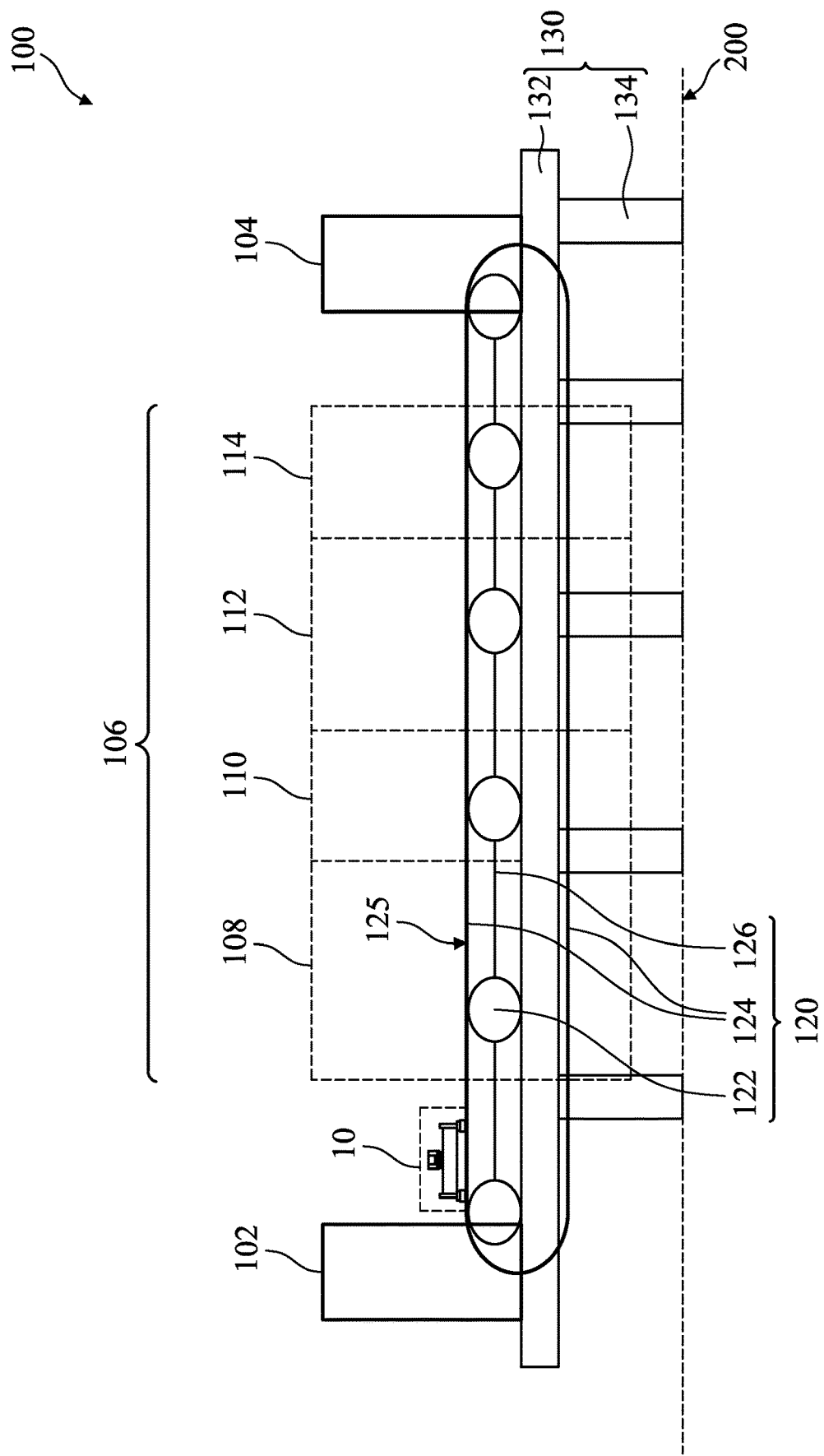
FIG. 2 illustrates a cross-sectional view of a package device cleaning apparatus in accordance with some embodiments.

FIG. 2 illustrates a cross-sectional view of a package device cleaning apparatus 100 in accordance with some embodiments. The package device cleaning apparatus 100 may be used for cleaning package devices, such as the package device 10 which may have numerous gaps 64. The package device cleaning apparatus 100 may include a package device loader 102, a package device unloader 104, a plurality of cleaning areas 106 disposed between the package device loader 102 and the package device unloader 104, and a conveyor 120 extending from the package device loader 102, through the cleaning areas 106, to the package device unloader 104. The conveyor 120 may include a plurality of conveyor supports 122 connected by a top frame 126. In some embodiments, the conveyor supports 122 have a cylindric shape (e.g., a circular or oval shape in the cross-sectional view) and are arranged as a line extending in a lateral direction. The top frame 126 may be substantially parallel to a ground surface 200. In some embodiments, the conveyor supports 122 and the top frame 126 may include a metal material, such as stainless steel, iron, or other suitable metal materials, or a polymer material, such as polytetrafluoroethylene (PTFE), perfluoroalkoxy alkane (PFA), or other suitable polymer materials.

The conveyor 120 may also include a belt 124 wrapping the conveyor supports 122 and the top frame 126. The belt 124 is moveable relative to the conveyor supports 122 and the top frame 126. The belt 124 may provide a movable upper surface 125 (e.g., outer surface of the belt 124 over the top frame 126) configured to transfer a package device from the package device loader 102, to pass through the cleaning areas 106, and to the package device unloader 104. For example, the movable upper surface 125 may move toward the package device unloader 104. The conveyor supports 122 and the top frame 126 are fixed at their positions while the movable upper surface 125 is moving. In some embodiments, the belt 124 and the top frame 126 include openings for allowing airflow or liquid to pass through. It is noted although FIG. 2 shows the movable upper surface 125 of the conveyor 120 extends substantially parallel to the top frame 126 (or the ground surface 200), as will be discussed in greater detail below, the conveyor 120 may comprise respective sections in different cleaning areas in which the movable upper surface 125 may extend horizontally, upward, or downward with respect to the top frame 126 (or the ground surface 200).

In some embodiments, the conveyor supports 122 are disposed on a base frame 130. The base frame 130 may include a plate 132 supported by a plurality of supporting legs 134. The base frame 130 may include a metal material such as stainless steel, iron, or other suitable metal materials, or a polymer material such as PTFE, PFA, or other suitable polymer materials. In some embodiments, the plate 132 may have openings to allow airflow or liquid to pass through.

In some embodiments, the cleaning areas 106 disposed between the package device loader 102 and the package device unloader 104 may include a first cleaning area 108 for a wet cleaning and a second cleaning area 110 disposed between the first cleaning area 108 and the package device unloader 104 for a dry cleaning. The wet cleaning may include dispensing liquid, such as a chemical cleaning solution or water, to a package device on the conveyor 120 for dissolving or forcibly removing contaminants attached to the package device. The dry cleaning may include delivering airflows such as air knives to a package device on the conveyor 120 for forcibly removing contaminants and residual liquid attached to the package device.

In some embodiments, as illustrated in FIG. 2, the cleaning areas 106 may further include a third cleaning area 112 disposed at a side of the second cleaning area 110 opposite to the first cleaning area 108 and a fourth cleaning area 114 disposed between the third cleaning area 112 and the package device unloader 104. In some embodiments, the third cleaning area 112 is for the wet cleaning, and the fourth cleaning area 114 is for the dry cleaning. In some embodiments, the first cleaning area 108 is for a chemical cleaning, and the third cleaning area 112 is for a water rinse cleaning. The fourth cleaning area 114 may have features and arrangements similar to the second cleaning area 110. In some embodiments, the conveyor 120 may transfer a package device loaded from the package device loader 102, passing through each of the cleaning areas 108, 110, 112, 114 in sequence for performing the wet cleaning and dry cleaning to the package device, and to the package device unloader 104. In some embodiments, the cleaning areas 106 include one or more wet cleaning areas or dry cleaning areas disposed between the fourth cleaning area 114 and the package device unloader 104.

Figure 3:
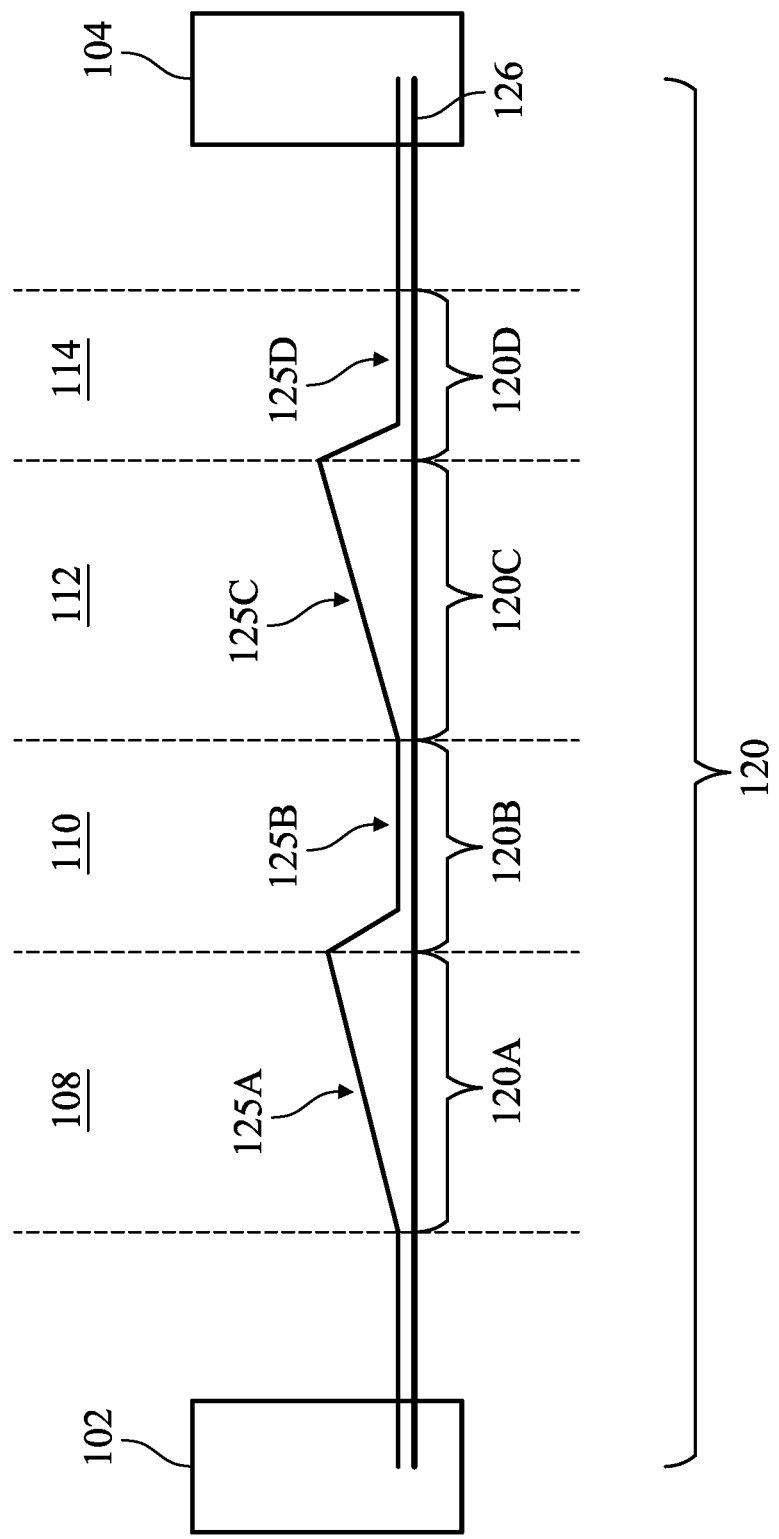
FIG. 3 illustrates a cross-sectional scheme showing the upper surfaces of the respective sections of the conveyor in the cleaning areas.

The conveyor 120 may include first to fourth sections 120A-120D in the first to fourth cleaning areas 108, 110, 112, 114, respectively. FIG. 3 illustrates a cross-sectional scheme showing respective movable upper surfaces 125A-125D of the first to fourth sections 120A, 120B, 120C, 120D of the conveyor 120, in accordance with some embodiments. In some embodiments, the movable upper surface 125A of the first section 120A and the movable upper surface 125C of the third section 120C are inclined or tilted upward from the beginning to the end of the first section 120A in the first cleaning area 108 and in the third section 120C in the third cleaning area 112, respectively. For example, the movable upper surfaces 125A of the first section 120A in the first cleaning area 108 and the movable upper surfaces 125A of the third section 120C in the third cleaning area 112 (e.g., wet cleaning areas) may be more distant away from the top frame 126 along a direction from the package device loader 102 to the package device unloader 104. As such, the package device may be titled with respect to the ground surface 200 when it is transferred to the first cleaning area 108 or the third cleaning areas 112, and the cleaning solution flowing through the package device may have an increased flow rate accelerated by gravity, thereby improving cleaning performance and efficiency. In some embodiments, the movable upper surface 125B of the second section 120B in the second cleaning area 110 and the movable upper surface 125D of the fourth section 120D in the fourth cleaning area 114 (e.g., dry cleaning areas) may have a portion less distant away from the ground surface 200 in the direction from the package device loader 102 to the package device unloader 104.

FIG. 4 illustrates a method 300 of cleaning a package device in accordance with some embodiments. In the embodiments illustrated below, the method 300 is performed in the package device cleaning apparatus 100 for cleaning the package device 10, although the method 300 can also be performed in other package device cleaning apparatuses and for cleaning other package devices. Firstly, step 302 is performed to load the package device 10 to the package device loader 102 of the package device cleaning apparatus 100 and dispose the package device 10 on the movable upper surface 125 of the conveyor 120. For example, the package device loader 102 may retrieve the tray 70 (with the package device 10 mounted thereon) from the device transferring tool, remove a protection lid (if present); and dispose the tray 70 (with the package device 10 mounted thereon) on the conveyor 120.

Figure 5:
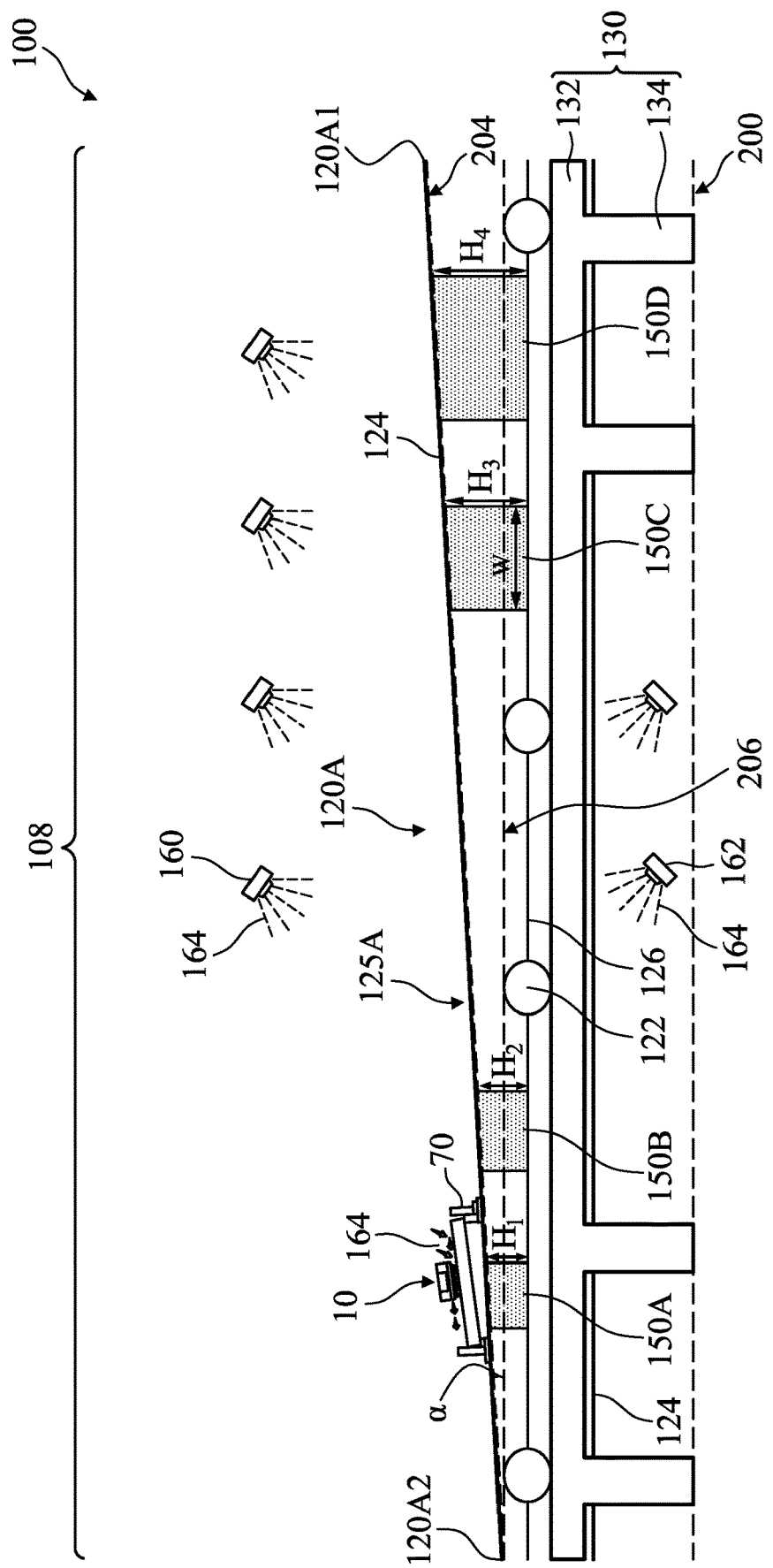
FIGS. 5 to 9 illustrate cross-sectional views of cleaning areas of a package device cleaning apparatus in accordance with some embodiments.

In some embodiments, the method 300 proceeds to step 304 to transfer the package device 10 to pass through the first cleaning area 108 by the first section 120A of the conveyor 120. FIG. 5 illustrates an enlarged cross-sectional view of the first cleaning area 108. The first section 120A of the conveyor 120 extends through the first cleaning area 108 for transferring the package device 10 through the first cleaning area 108. A wet cleaning process (e.g., chemical cleaning process) may be performed for cleaning the package device 10 while the package device 10 is disposed over the movable upper surface 125A and moving in the first cleaning area 108.

In some embodiments, the first section 120A of the conveyor 120 includes at least one height raising support, for example, the height raising supports 150A-150D (collectively referred to as height raising support 150) disposed over the top frame 126. In some embodiments, each of the height raising supports 150A-150D includes a bottom surface parallel to the top frame 126 (or the ground surface 200) and an upper surface tilted with respect to the top frame 126. The height raising support 150 may lift the belt 124 and tilt the movable upper surface 125A of the first section 120A of the conveyor 120 from the top frame 126. As such, the movable upper surface 125A of the first section 120A may extend along a first surface 204, where the first surface 204 includes the upper surfaces of the height raising supports 150A-150D and is more distant away from the top frame 126 along a direction from the package device loader 102 to the package device unloader 104. As such, a first side 120A1 of the first section 120A of the conveyor 120 opposite to the package device loader 102 is at a level higher than a level of a second side 120A2 of the first section 120A adjacent to the package device loader 102, in accordance with some embodiments. For example, the movable upper surface 125A of the first section 120A (or, e.g., the first surface 204) may have a tilt angle α with respect to the top frame 126 (or the ground surface 200) in a range from 1 degree to 10 degrees, such as for example, 4 degrees. In FIG. 2, the tilt angle α is represented as an angle between the first surface 204 and a surface 206 parallel to the top frame 126.

Figure 10B:
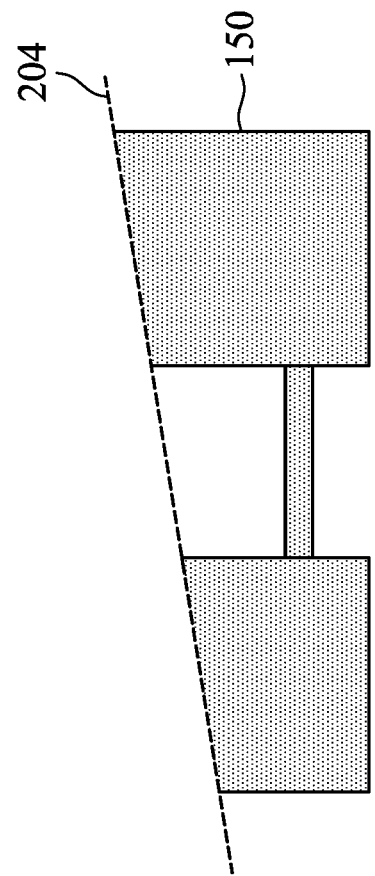
FIGS. 10A and 10B illustrate cross-sectional views of exemplary height raising supports in accordance with some embodiments.
Figure 10A:
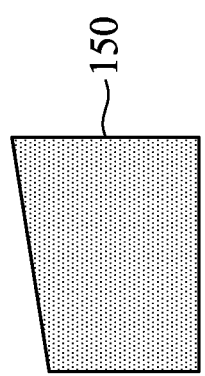

In some embodiments, the height raising support 150 comprises a trapezoid shape, a trapezoid-like shape, a dumbbell shape having trapezoid or trapezoid-like ends which have coplanar upper surfaces, or the like, as illustrated in FIGS. 10A and 10B. In some embodiments, the height raising support 150 also includes one or more notches (not shown) at the bottom or corners of the height raising support 150 for locking the height raising support 150 onto the top frame 126. In some embodiments, the height raising support 150 is a polymer material comprising polytetrafluoroethylene (PTFE), polychlorotrifluoroethylene (PCTFE), perfluoroalkoxy alkane (PFA), polyvinylidene fluoride (PVDF), polypropylene (PP), polyether ether ketone (PEEK), or the like, or a combination thereof.

In some embodiments, the first height raising support 150A (e.g., the one adjacent to the package device loader 102) has a height $H_1$ in a range from 0.05 cm to 0.3 cm at its longer sidewall. The second height raising support 150B may have a height H2 in a range from 0.3 cm to 0.4 cm at its longer sidewall, which is greater than the height $H_1$. The third height raising support 150C may have a height H3 in a range from 0.5 cm to 0.9 cm at its longer sidewall, which is greater than the height H2. The fourth height raising support 150D may have a height H4 in a range from 1 cm to 1.5 cm at its longer sidewall, which is greater than the height H3. In some embodiments, each of the height raising supports 150A-150D may have a substantially same width W, such as in a range from 60 cm to 80 cm. Although FIG. 4 shows four height raising supports 150A-150D, it is for illustration only, and any quantities of the height raising supports may be used.

In some embodiments, the first cleaning area 108 includes a plurality of upper nozzles 160 disposed over the first section 120A of the conveyor 120. The upper nozzles 160 may be configured to dispense a chemical cleaning solution 164, which may dissolve the contaminants stuck in the gaps 64 or attached on the package components 20 and 30 (see FIG. 1) to the chemical cleaning solutions. For example, the upper nozzles 160 may dispense the chemical cleaning solution 164 toward a direction opposite to the moving direction of the movable upper surface 125A of the first section 120A of the conveyor 120 with a tilt angle in a range from 30 degrees to 60 degrees above the movable upper surface 125A of the first section 120A of the conveyor 120. In some embodiments, a plurality of lower nozzles 162 is disposed below the plate 132 of the base frame 130 and between the supporting legs 134. The lower nozzles 162 may be configured to dispense the chemical cleaning solution 164 from a different angle than the upper nozzles 160. For example, the lower nozzles 162 may dispense the chemical cleaning solution 164 toward a direction opposite to the moving direction of the movable upper surface 125A of the first section 120A of the conveyor 120 with a tilt angle of 40 degrees to 70 degrees below the movable upper surface 125A of the first section 120A of the conveyor 120. The lower nozzles 162 may be disposed at any suitable positions between the supporting legs 134 as long as dispensing routes of the lower nozzles 162 are not blocked by the height raising support 150. In some embodiments, each of the upper nozzles 160 and each of the lower nozzles 162 may dispense the chemical cleaning solution 164 with a pressure of 1 kg/cm$^2$ to 20 kg/cm$^2$. In some embodiments, the chemical cleaning solution 164 includes a basic aqueous solution such as KOH, NaOH, or the like, or a combination thereof for dissolving the solder flux or solder paste.

Because the package device 10 is disposed on the movable upper surface 125A when the cleaning process is performed in the first cleaning area 108, the package device 10 and the gaps 64 between the conductive connectors 60 (see FIG. 1) are tilted with respect to the ground surface 200. The chemical cleaning solution flowing into the gaps 64 may have an increased flowing rate accelerated by gravity. Additionally, the flow rate may increase as the tilt angle $\alpha$ increases. In some embodiments, when the tilt angle a is increased to about 4 degrees from zero degrees, the flow rate of the chemical cleaning solution flowing through the gaps 64 can be improved 1.79 times or more. Accordingly, the chemical cleaning solution 164 flowing into the gaps 64 may have sufficient momentum to overcome the capillary force so that it may flow through most of the gaps 64 and carry the dissolved contaminants to leave the gaps 64, thereby improving the performance and efficiency of the chemical cleaning.

Figure 6:
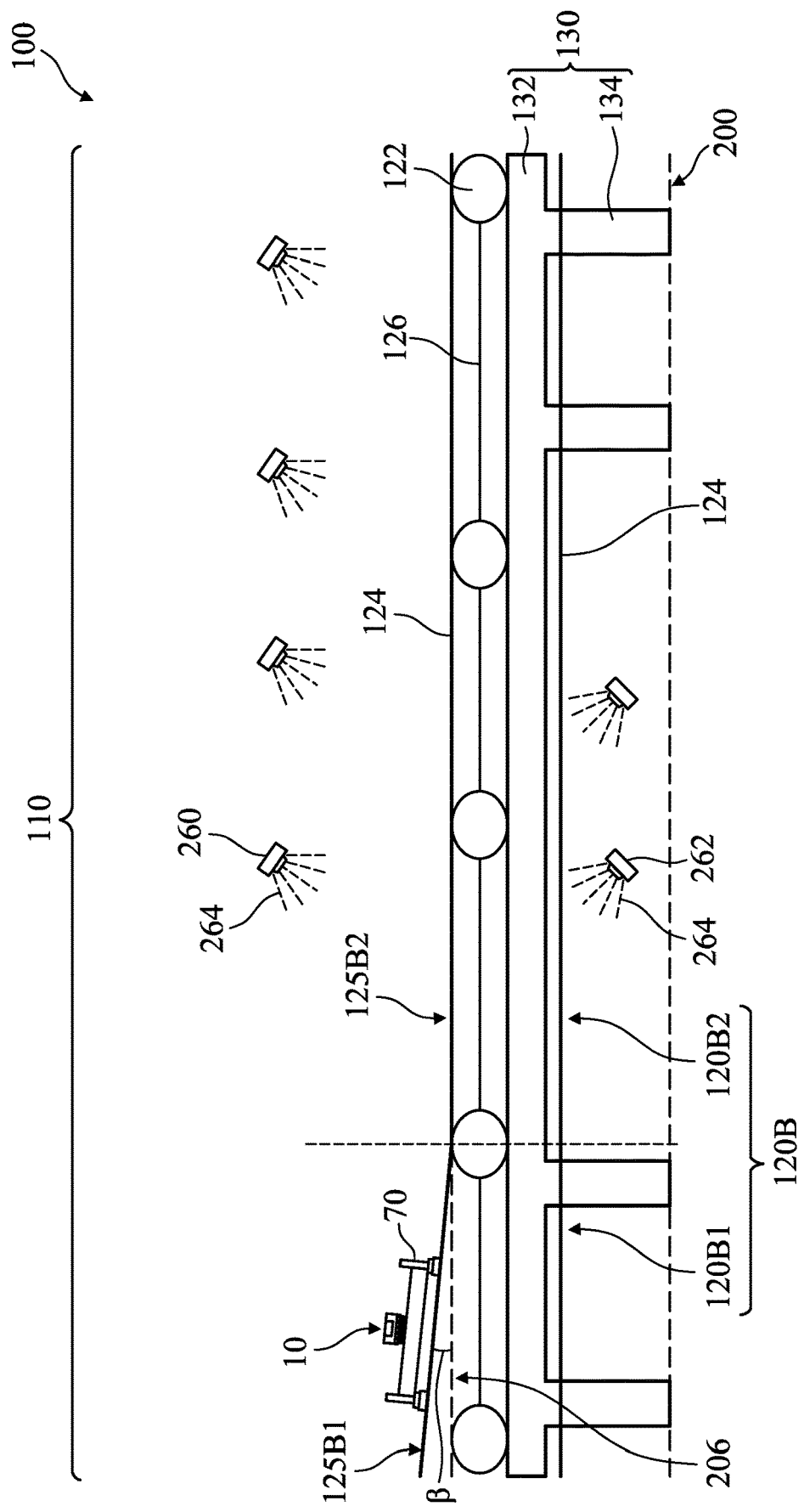

In some embodiments, the method 300 proceeds to step 306 to transfer the package device 10 to pass through the second cleaning area 110 by the second section 120B of the conveyor 120. FIG. 6 illustrates an enlarged cross-sectional view of the second cleaning area 110 in accordance with some embodiments. The second section 120B of the conveyor 120 extends through the second cleaning area 110 for transferring the package device 10 through the second cleaning area 110. A dry cleaning process is performed for cleaning the package device 10 while the package device 10 is disposed over the movable upper surfaces 125B1 and 125B2 of the second section 120B and moving in the second cleaning area 110.

In some embodiments, the second section 120B of the conveyor 120 includes no height raising support on the top frame 126. The second section 120B of the conveyor 120 may include a first portion 120B1 extending from the first section 120A of the conveyor 120 and a second portion 120B2 extending from the first portion 120B1 of the second section 120B of the conveyor 120. The movable upper surface 125B1 of the first portion 120B1 of the second section 120B may fall from the level of the first side 120A1 102A1 of the first section 120A to a level of the top surfaces of the conveyor supports 122. As such, the movable upper surface 125B1 of the first portion 120B1 of the second section 120B is less distant away from the top frame 126 in the direction from the package device loader 102 to the package device unloader 104. In some embodiments, the movable upper surface 125B1 of the first portion 120B1 of the second section 120B has a tilt angle $\beta$ in a range from 0 degrees to 4 degrees with respect to the top frame 126 (or the ground surface 200). In FIG. 3, the tilt angle $\beta$ is represented as an angle between movable upper surface 125 and a surface 206 parallel to the top frame 126.

In some embodiments, the second section 120B of the conveyor 120 also includes a second portion 120B2 extending from the first portion 120B1 of the second section 120B and through the remaining length of the second cleaning area 110. The belt 124 may lie on the conveyor supports 122 in the second portion 120B2 of the second section 120B of the conveyor 120 and extends at a level same as the second side 120A2 of the first section 102A of the conveyor 120, which allows the belt 124 enters the next cleaning area (e.g., the third cleaning area 112) at a lower level. In some embodiments, the first portion 120B1 and the second portion 120B2 of the second section 120B of the conveyor 120 have a length ratio of in a range from 1/5 to 5.

A plurality of upper nozzles 260 is disposed above the second section 120B of the conveyor 120, and a plurality of lower nozzles 262 is below the second section 120B of the conveyor 120 in accordance with some embodiments. The upper nozzles 260 and lower nozzles 262 may concentrate and direct air to form air knives 264. The air knives 264 may be delivered to the package device 10 to forcibly remove residues and liquids attached to the package components 20 and 30 or in the gaps 64. For example, the upper nozzles 260 may direct the air knives 264 toward a direction opposite to the moving direction of the movable upper surface 125B2 of the second portion 120B2 of the second section 120B of the conveyor 120, such as a direction with a tilt angle of 30 degrees to 60 degrees above the movable upper surface 125B2 in the second portion 120B2 of the second section 120B. In some embodiments, a plurality of lower nozzles 262 is disposed below the plate 132 of the base frame 130 and between the supporting legs 134. The lower nozzles 262 may be configured to deliver the air knives from a different angle than the upper nozzles 260. The lower nozzles 262 may direct the air knives 264 toward a direction opposite to the moving direction of the movable upper surface 125B2 in the second portion 120B2 of the second section 120B, such as a direction with a tilt angle of 40 degrees to 70 degrees below the movable upper surface 125B2 of the second portion 120B2 of the second section 120B. The lower nozzles 262 may be disposed at any suitable positions between the supporting legs 134. In some embodiments, each of the upper nozzles 260 and each of the lower nozzles 262 may provide the air knives 264 with a pressure of 1 kPa to 10 kPa.

Figure 7:
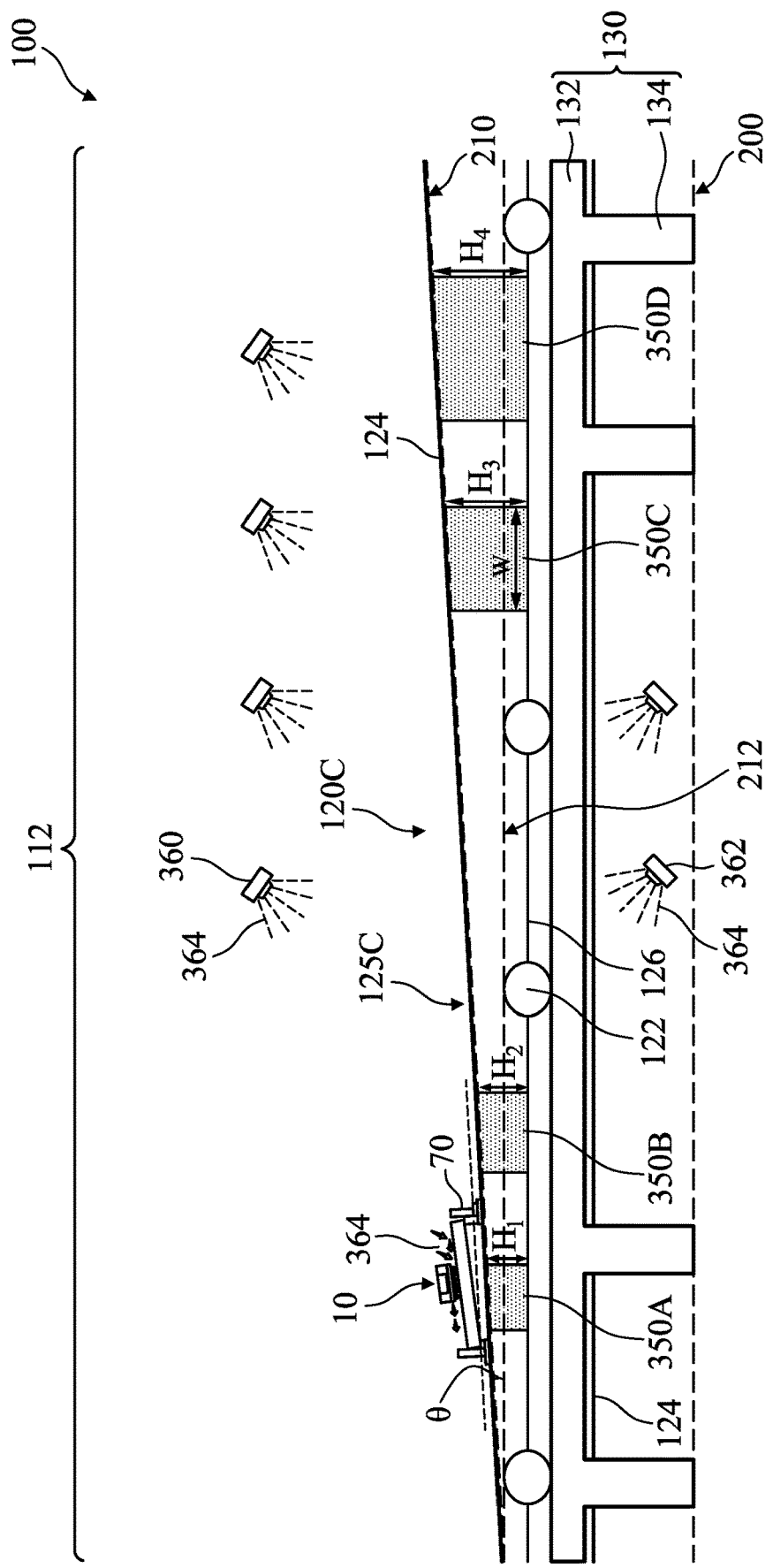

In some embodiments, the method 300 proceeds to step 308 to transfer the package device 10 to pass through the third cleaning area 112 by the third section 120C of the conveyor 120. FIG. 7 illustrates an enlarged cross-sectional view of the third cleaning area 112. The third section 120C of the conveyor 120 extends through the third cleaning area 112 for transferring the package device 10 through the third cleaning area 112. A wet cleaning process (e.g., water rinse cleaning process) is performed for cleaning the package device 10 while the package device 10 is disposed on the movable upper surface 125C in the third section 120C of the conveyor 120 and moving in the third cleaning area 112.

In some embodiments, a plurality of height raising supports 350A-350D (collectively referred to as height raising support 350) may be disposed on the top frame 126. In some embodiments, the height raising support 350 has the same shape and material as the height raising support 150, although the upper surface of the height raising support 350 may have different slopes than that of the height raising support 150. The third section 120C of the conveyor 120 is lifted by the height raising support 350 to be tilted from the top frame 126. Accordingly, the movable upper surface 125C of the third section 120C of the conveyor 120 may extend along a second surface 210, where the second surface 210 may include the upper surfaces of the height raising supports 350A-350D and be more distant away from the top frame 126 in the direction from the package device loader 102 to the package device unloader 104. For example, the movable upper surface 125C of the third section 120C (or, e.g., the second surface 210) may have a tilt angle θ (or the ground surface 200) with respect to the top frame 126 in a range from 1 degree to 10 degrees, such as for example, 4 degrees. In FIG. 7, the tilt angle θ is represented as an angle between the second surface 210 and a surface 212 parallel to the top frame 126.

In some embodiments, a plurality of upper nozzles 360 is disposed above the third section 120C of the conveyor 120, and a plurality of lower nozzles 362 is below the third section 120C of the conveyor 120. The upper nozzles 360 and the lower nozzles 362 in the third cleaning area 112 may be arranged in the same positions as the upper nozzles 160 and lower nozzles 162 in the first cleaning area 108, respectively. The upper nozzles 360 and the lower nozzles 362 may dispense a cleaning solution 364 (e.g., water) to the package device 10 on the third section 120C of the conveyor 120 to rinse the package device 10 and remove the residual contaminants and the residual chemical cleaning solution 164 in the gaps 64. In some embodiments, each of the upper nozzles 260 and lower nozzles 262 may dispense water with a pressure of 5 kg/cm$^2$ to 15 kg/cm$^2$.

Because the package device 10 is disposed on the movable upper surface 125C when the cleaning process is performed in the third cleaning area 112, the package device 10 and the gaps 64 between the conductive connectors 60 (see FIG. 1) are tilted with respect to the ground surface 200. The cleaning solution 364 flowing into the gaps 64 may have an increased flowing rate accelerated by gravity. Additionally, the flow rate may increase as the tilt angle θ increases. Accordingly, cleaning solution 364 flowing into the gaps 64 may have sufficient momentum to overcome the capillary force to flow through most of the gaps 64 and carry the dissolved contaminants to leave the gaps 64, thereby improving the performance and efficiency of the wet cleaning.

Next, in some embodiments, the package device 10 may be transferred to other cleaning areas by the conveyor 120, in accordance with some embodiments. For example, the package device 10 may be transferred to the fourth cleaning area 114 illustrated in FIG. 2. The fourth cleaning area 114 may have the same features and arrangements as the second cleaning area 110. A cleaning step similar to step 306 may be performed in the fourth cleaning area 114. In some embodiments, any combinations of the first cleaning area 108, the second cleaning area 110, and the third cleaning area 112 may be disposed between the fourth cleaning area 114 and the package device unloader 104. In some embodiments, one or more dry cleaning areas may be arranged as the final cleaning areas that the package device 10 will be transferred through to reduce the moisture in the package device 10.

In some embodiments, the method 300 proceeds to step 310 to transfer the package device 10 to the package device unloader 104 by the conveyor 120. The package device unloader 104 may put the protection lid (if present) on the tray 70 and unload the package device 10 with the tray 70 from the package device cleaning apparatus 100. The tray 70, with the package device 10 mounted thereon, may be retrieved and transferred to another apparatus by the device transferring tool.

Figure 8:
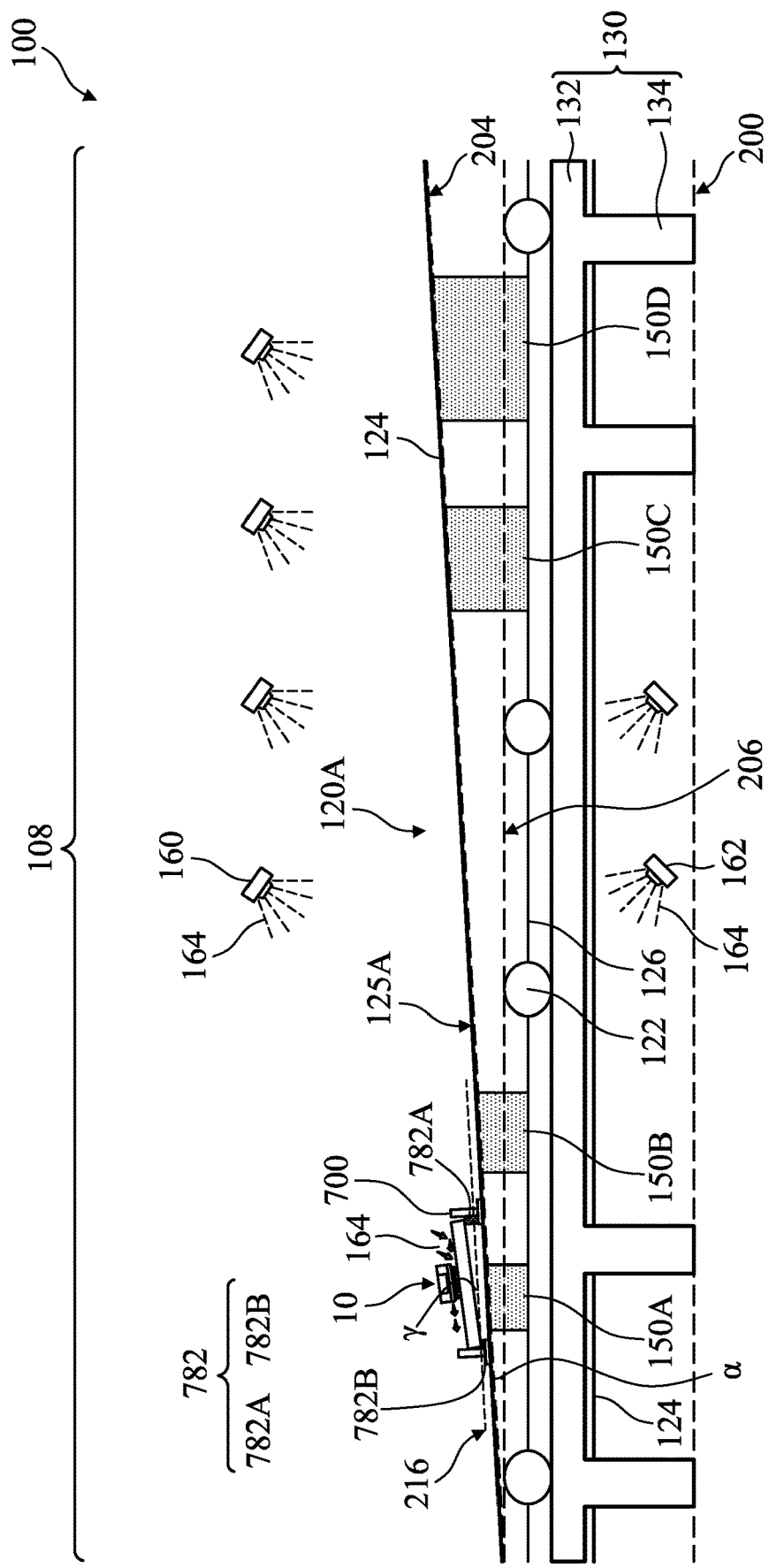

FIG. 8 illustrates a cross-sectional view of the first cleaning area 108 where a tray 700 is disposed over the first section 120A of the conveyor 120 in accordance with some embodiments. For example, the package device loader 102 may provide the tray 700 to replace the tray 70 for performing the cleaning processes in the package device cleaning apparatus 100. The tray 700 may comprise the same structure and material as the tray 70, and with a spacer 782 that has an inclined upper surface. The spacer 782 may have a first side 782A and a second side 782B opposite to each other, and the first side 782A may have a height greater than that of the second side 782B. In some embodiments, the first side 782A of the spacer 782 may have a height in a range from 0.1 mm to 5 mm. The package device 10 may be disposed over the spacer 782. As such, when disposing the tray 700 on the first section 120A of the conveyor, the package device 10 may have a tilt angle α+γ with respect to the movable upper surface 125A (In FIG. 8, the tilt angle γ is represented using the angle between the package device 10 and a surface 216 parallel to the movable upper surface 125A). As such, the package device 10 may have a tilt angle α+γ with respect to the top frame 126 (or the ground surface 200). The tilt angle α+γ is greater than angle γ, and therefore the flow rate of the chemical cleaning solution 164 in the gaps 64 may be further increased by the acceleration of gravity. In some embodiments, the tilt angle γ is in a range from 1 degree to 4 degrees. However, in some embodiments, a too-large tilt angle α, β, or γ increases the flipping risk of the package device 10 for moving on the conveyor 120.

In some embodiments, the tray 700 with the package device 10 is transferred through other cleaning areas such as the second to fourth cleaning areas 108 to 112 (not shown) for performing wet and dry cleaning processes in these areas. After the cleaning processes in the cleaning areas 106 are complete, the package device 10 is transferred to the package device unloader 104 by the conveyor 120. The package device unloader 104 may retrieve the package device 10 from the tray 700 and mount it to the tray 70. The package device unloader 104 may unload tray 70 (with the package device 10 mounted thereon) from the package device cleaning apparatus 100. The tray 70, with the package device 10 mounted thereon, may be retrieved and transferred to another apparatus by the device transferring tool.

Figure 9:
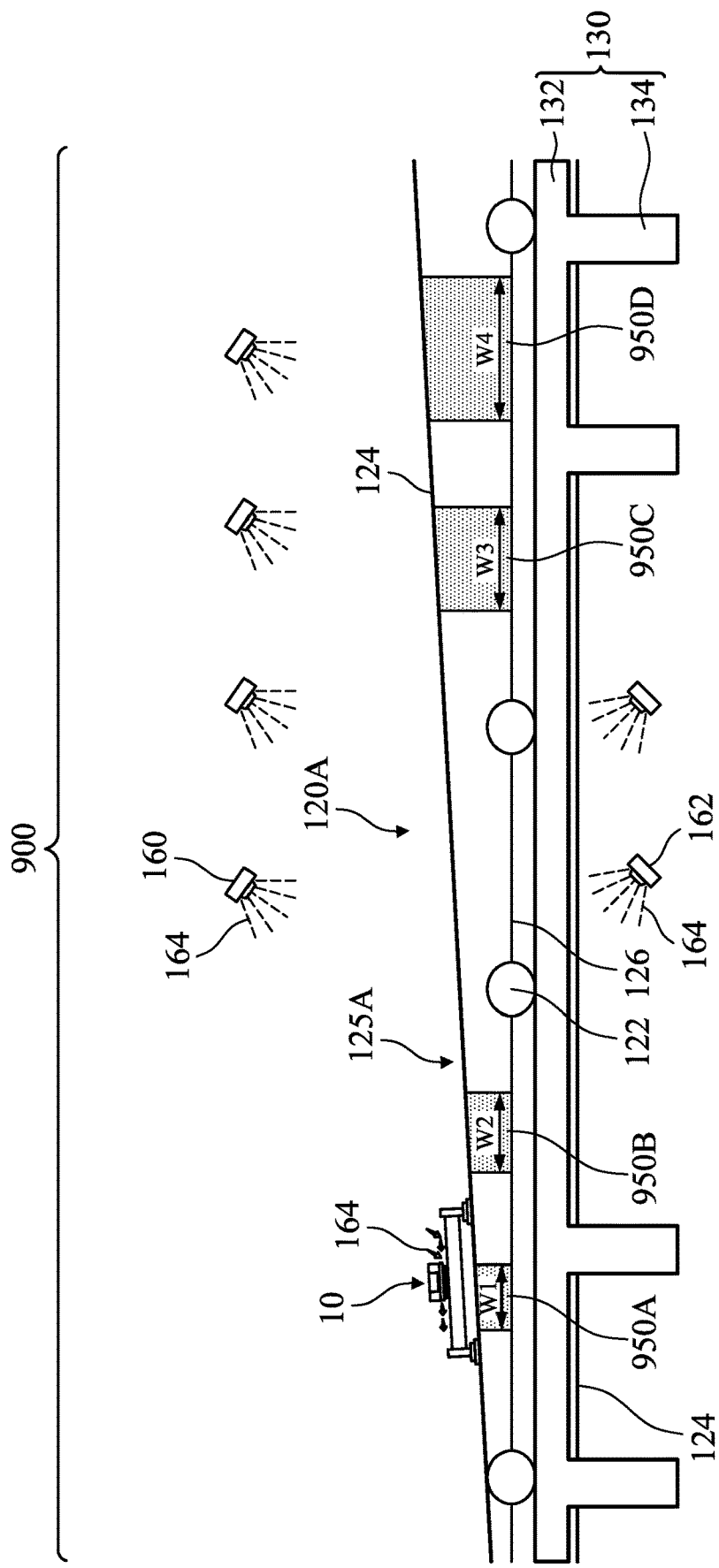

FIG. 9 illustrates a wet cleaning area 900 of a package device cleaning apparatus 100 in accordance with some embodiments. The wet cleaning area 900 may have the same features and arrangements as the first cleaning area 108 or the third cleaning area 112, where the height raising supports 950A-950D may have gradually increased widths in the direction from the package device loader 102 to the package device unloader 104. For example, the height raising support 950A may have a width W1 in a range from 60 cm to 80 cm; the height raising support 950B may have a width W2 in a range from 44 cm to 65 cm; the height raising support 950C may have a width W3 in a range from 44 cm to 65 cm; and the height raising support 950D may have a width W4 in a range from about 44 cm to 65 cm. The gradually increased widths of the height raising supports 950A-950D may allow the height raising supports 950A-950D to have a greater foundation to support their increased heights and provide greater surface areas to allow belt 124 to lie on, thereby increasing the structural strength of the conveyor 120 and the height raising supports 950A-950D, in accordance with some embodiments.

According to embodiments of the present disclosure, a package device cleaning apparatus and a method of cleaning a package device that may provide improved cleaning performance and efficiency are provided. The package device cleaning apparatus may comprise a conveyor configured to transfer the package device from a package loader, to pass through wet and dry cleaning areas for performing various cleaning processes and to a package unloader. In some embodiments, the conveyor comprises respective sections in the wet and dry cleaning areas. With inserting height raising supports to lift the movable upper surface from form a top frame, the movable upper surfaces of respective sections of the conveyor in the wet cleaning areas may be tilted, such as more distant away from a ground surface along a direction from the package loader to the package unloader. As such, cleaning solutions flowing through narrow gaps between conductive connectors of the package device may have an increased flow rate accelerated by gravity and have sufficient momentum to carry contaminants to leave the gaps, thereby improving cleaning performance and efficiency. In some embodiments, the movable upper surface of the conveyor in the dry cleaning areas may fall down to a lower level for allowing the movable upper surface of the conveyor to extend upward from the lower level in the next wet cleaning area.

In an embodiment, an apparatus for cleaning a package device includes a package device loader; a package device unloader; a first cleaning area disposed between the package device loader and the package device unloader; and a conveyor including a frame extending from the package device loader to the package device unloader and through the first cleaning area; and a belt wrapping the frame, wherein the belt includes a movable upper surface between the package device loader and the package device unloader, wherein the movable upper surface is configured to move relative to and over the frame, and a first distance between the movable upper surface in the first cleaning area and the frame increases in a direction from the package device loader to the package device unloader. In an embodiment, the movable upper surface in the first cleaning area has a tilt angle of 1 degree to 10 degrees with respect to the frame. In an embodiment, the apparatus further includes a second cleaning area disposed between the first cleaning area and the package device unloader, wherein the frame and the movable upper surface extend through the second cleaning area, wherein the movable upper surface in the second cleaning area includes a first portion that is connected to the movable upper surface in the first cleaning area and has a second distance to the frame, the second distance decreasing in the direction from the package device loader to the package device unloader. In an embodiment, the movable upper surface in the second cleaning area further includes a second portion extending in a direction parallel to the frame. In an embodiment, the apparatus further includes a third cleaning area disposed between the second cleaning area and the package device unloader, wherein the frame and the movable upper surface extend through the third cleaning area, and a distance between the movable upper surface in the third cleaning area and the frame increases in the direction from the package device loader to the package device unloader. In an embodiment, the first cleaning area is a wet cleaning area, and the second cleaning area is a dry cleaning area. In an embodiment, the apparatus further includes a first height raising support disposed on the frame and below the movable upper surface in the first cleaning area, wherein the first height raising support has an upper surface substantially parallel to the movable upper surface. In an embodiment, the apparatus further includes a second height raising support disposed adjacent to the first height raising support, and a width of the first height raising support is greater than a width of the second height raising support. In an embodiment, the apparatus further includes a nozzle disposed below the frame and between the first height raising support and the second height raising support. In an embodiment, the apparatus further includes a tray including a spacer surrounding a slot, wherein the spacer has a first side and a second side opposite to each other, and a height of the first side is greater than a height of the second side.

In an embodiment, an apparatus for cleaning a package device includes a package device loader; a package device unloader; a first cleaning area and a second cleaning area disposed between the package device loader and the package device unloader; and a conveyor connecting to the package device loader and the package device unloader and including a first section extending through the first cleaning area and a second section extending through the second cleaning area, wherein the first section of the conveyor includes a first movable upper surface extending upward in a direction from the package device loader to the package device unloader. In an embodiment, the conveyor further includes a height raising support disposed below the first movable upper surface, wherein the height raising support includes an upper surface extends upward in the direction from the package device loader to the package device unloader, and wherein the first movable upper surface includes a portion conformal to the upper surface of the height raising support. In an embodiment, the height raising support has a trapezoid shape in a cross-sectional view. In an embodiment, the second section of the conveyor includes a second movable upper surface, wherein the second movable upper surface includes a first portion connected to the first movable upper surface and extending downward in the direction from the package device loader to the package device unloader. In an embodiment, the second movable upper surface further includes a second portion connected to a side of the first portion of the second movable upper surface opposite to the first movable upper surface and extending horizontally.

In an embodiment, a method of cleaning a package device includes disposing the package device on a conveyor which includes a frame and a belt, the frame extending through a first cleaning area and a second cleaning area and connecting to a package device loader and a package device unloader, the belt wrapping around the frame, wherein the belt the provides a movable upper surface, the movable upper surface configured to move relative and over the frame, wherein the movable upper surface in the first cleaning area includes a first portion and a second portion, the first portion being closer to the package device loader than the second portion, wherein the movable upper surface in the first portion of the first cleaning area and the frame are separated by a first distance, wherein the movable upper surface in the second portion of the first cleaning area and the frame are separated by a second distance, the second distance being greater than the first distance; and moving the package device by the movable upper surface and performing a first cleaning process for the package device in the first cleaning area and performing a second cleaning process for the package device in the second cleaning area. In an embodiment, the first cleaning process includes a wet cleaning process, and the second cleaning process includes a dry cleaning process. In an embodiment, the movable upper surface in the second cleaning area includes a third portion and a fourth portion, the third portion being closer to package device loader than the fourth portion, wherein the movable upper surface in the third portion of the second cleaning area and the frame are separated by a third distance, wherein the movable upper surface in the fourth portion of the second cleaning area and the frame are separated by a fourth distance, the fourth distance being greater than the third distance. In an embodiment, the conveyor further includes a third cleaning area disposed between the second cleaning area and the package device unloader and extended through by the frame and the movable upper surface, the movable upper surface in the third cleaning area includes a fifth portion and a sixth portion, the fifth portion being closer to the package device loader than the sixth portion, wherein the movable upper surface in the fifth portion of the third cleaning area and the frame are separated by a fifth distance, wherein the movable upper surface in the sixth portion of the third cleaning area and the frame are separated by a sixth distance, the sixth distance being greater than the fifth distance. In an embodiment, the method further includes disposing the package device on a spacer of a tray before disposing the package device on the conveyor, wherein the spacer includes a first side and a second side opposite to each other, and a height of the first side is greater than a height of the second side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning a package device, the method comprising:
   disposing the package device on a conveyor which comprises a frame and a belt, the frame extending through a first cleaning area and a second cleaning area and connecting to a package device loader and a package device unloader, the belt wrapping around the frame, wherein the belt provides a movable upper surface, the movable upper surface configured to move relative and over the frame, wherein the movable upper surface in the first cleaning area comprises a first portion and a second portion, the first portion being closer to the package device loader than the second portion, wherein the movable upper surface in the first portion of the first cleaning area and the frame are separated by a first distance, wherein the movable upper surface in the second portion of the first cleaning area and the frame are separated by a second distance, the second distance being greater than the first distance; and
   moving the package device by the movable upper surface and performing a first cleaning process for the package device in the first cleaning area and performing a second cleaning process for the package device in the second cleaning area.

2. The method of claim 1, wherein the first cleaning process comprises a wet cleaning process, and the second cleaning process comprises a dry cleaning process.

3. The method of claim 1, wherein the movable upper surface in the second cleaning area comprises a third portion and a fourth portion, the third portion being closer to the package device loader than the fourth portion, wherein the movable upper surface in the third portion of the second cleaning area and the frame are separated by a third distance, wherein the movable upper surface in the fourth portion of the second cleaning area and the frame are separated by a fourth distance, the fourth distance being greater than the third distance.

4. The method of claim 3, wherein the conveyor further comprises a third cleaning area disposed between the second cleaning area and the package device unloader and extended through by the frame and the movable upper surface, the movable upper surface in the third cleaning area comprises a fifth portion and a sixth portion, the fifth portion being closer to the package device loader than the sixth portion, wherein the movable upper surface in the fifth portion of the third cleaning area and the frame are separated by a fifth distance, wherein the movable upper surface in the sixth portion of the third cleaning area and the frame are separated by a sixth distance, the sixth distance being greater than the fifth distance.

5. The method of claim 1, further comprising disposing the package device on a spacer of a tray before disposing the package device on the conveyor, wherein the spacer comprises a first side and a second side opposite to each other, and a height of the first side is greater than a height of the second side.

6. A method of cleaning a package device, the method comprising:
   disposing the package device on a conveyor, the conveyor including a movable surface, the movable surface extending through a first cleaning area and a second cleaning area, wherein the movable surface is tilted relative to horizontal in the first cleaning area;
   moving the package device by the movable surface to the first cleaning area and performing a first cleaning process to the package device; and
   moving the package device by the movable surface to the second cleaning area and performing a second cleaning process to the package device.

7. The method of claim 6, wherein the first cleaning process comprises wet cleaning.

8. The method of claim 7, wherein a cleaning solution for the first cleaning process is an aqueous solution comprising potassium hydroxide (KOH), sodium hydroxide (NaOH), or a combination thereof.

9. The method of claim 8, wherein the cleaning solution is applied to the package device with a dispensing pressure ranging from 1 kg/cm² to 20 kg/cm².

10. The method of claim 9, wherein the movable surface is tilted relative to the horizontal by a tilt angle ranging from 1° to 10°.

11. The method of claim 6, wherein the second cleaning process comprises drying using air nozzles to apply air to the package device.

12. The method of claim 11, wherein the air nozzles apply the air to the package device at a pressure ranging from 1 kPa to 10 kPa.

13. A method of cleaning a package device, the method comprising:
disposing the package device on a portion of a movable belt;
moving the package device by the movable belt through a wet cleaning region, wherein a cleaning solution is dispensed onto the package device, and the portion of the movable belt that the package device is disposed on is tilted relative to horizontal in the wet cleaning region; and
moving the package device by the movable belt through a dry cleaning region, wherein the portion of the movable belt that package device is disposed on is parallel to the horizontal in the dry cleaning region.

14. The method of claim 13, wherein the cleaning solution is an aqueous solution comprising potassium hydroxide (KOH), sodium hydroxide (NaOH), or a combination thereof.

15. The method of claim 13, wherein the cleaning solution is dispensed in the wet cleaning region at a dispensing pressure ranging from 1 kg/cm² to 20 kg/cm².

16. The method of claim 13, wherein the portion of the movable belt that the package device is disposed on is tilted relative to the horizontal in the wet cleaning region by a tilt angle ranging from 1° to 10°.

17. The method of claim 13, wherein the portion of the movable belt that the package device is disposed on is tilted relative to the horizontal by a first tilt angle as great as 10° ramping the movable belt up, and a second title angle as great as 4° ramping the movable belt down.

18. The method of claim 13, further comprising directing airflow to the package device in the dry cleaning region.

19. The method of claim 18, wherein the directing airflow comprises an air knife.

20. The method of claim 19, wherein the air knife directs air to the package device at a pressure ranging from 1 kPa to 10 kPa.

* * * * *